United States Patent [19]

Honn et al.

[11] 4,074,342
[45] Feb. 14, 1978

[54] ELECTRICAL PACKAGE FOR LSI DEVICES AND ASSEMBLY PROCESS THEREFOR

[75] Inventors: James Joseph Honn; Kenneth P. Stuby, both of Manassas, Va.

[73] Assignee: International Business Machines Corporation, Armonk, N.Y.

[21] Appl. No.: 534,967

[22] Filed: Dec. 20, 1974

[51] Int. Cl.² ............................................. H05K 1/04
[52] U.S. Cl. .................................................. 361/411
[58] Field of Search ..................... 317/101 A, 101 D; 357/74, 75; 174/52 H; 361/411

[56] References Cited

U.S. PATENT DOCUMENTS

| 3,323,022 | 5/1967 | DaCosta | 317/101 D |
| 3,437,883 | 4/1969 | Smith | 357/74 |
| 3,577,037 | 5/1971 | DiPietro et al. | 317/101 A |
| 3,604,989 | 9/1971 | Haneta et al. | 317/101 A |
| 3,648,131 | 3/1972 | Stuby | 317/101 A |
| 3,777,220 | 12/1973 | Tatusko et al. | 317/101 A |
| 3,952,231 | 4/1976 | Davidson et al. | 317/101 CM |

FOREIGN PATENT DOCUMENTS

| 2,001,970 | 10/1969 | France | 317/101 CC |

*Primary Examiner*—David Smith, Jr.
*Attorney, Agent, or Firm*—Joseph C. Redmond, Jr.

[57] ABSTRACT

An electrical package for Large Scale Integrated (LSI) devices includes a carrier having (a) thermal expansion similar to a semiconductor, (b) a standard array of terminal pins (100 or more) and (c) a circuit transposer that is (i) a semiconductor material, typically silicon and (ii) readily personalized to connect any combination of attached LSI devices to the input-output terminal pins. The package utilizes solder technology to interconnect the carrier, circuit transposer and LSI devices. The carrier and semiconductor transposer eliminate mechanical stress on the solder joints that would otherwise occur from thermal coefficient expansion (TCE) mismatch between dissimilar package materials. The circuit transposer increases the wirability of electrical packages utilizing solder technology. Reliability problems presented by thick film paste or metallized conductors on carriers are also overcome by the semiconductor circuit transposer. The package may be fabricated by commercially acceptable processes that are automatable.

1 Claim, 12 Drawing Figures

ELECTRICAL PACKAGE FOR LSI DEVICES AND ASSEMBLY PROCESS THEREFOR

BACKGROUND OF INVENTION a. Field of Invention

This invention relates to electrical packages and processes of assembly thereof. More particularly, the invention relates to electrical packages for integrated circuit devices and processes of assembly thereof.

b. Description of Prior Art

Electrical packages of the type shown in U.S. Pat. Nos. 3,648,131 or 3,340,438, both assigned to the present assignee, are sensitive to (1) thermal coefficient expansion (TCE) mismatch between the substrate or carrier and attached semiconductor devices and (2) reliability problems associated with (i) more than 100 solder pad or connections between a device and carrier and (ii) conductor personalization of the substrate to connect the integrated devices to the terminal pins or other external connections. One solution to a thermal mismatch or TCE problem is to select carrier materials that have substantially the same thermal expansion coefficient as that of the attached semiconductor devices. See, for example, U.S. Pat. No. 3,777,220, also assigned to the present assignee, which addresses the TCE mismatch problem but does not address the solder pad or conductor reliability problems. A solution for the solder pad reliability problem is to increase the number of integrated devices in a package but limit each device to less than 100 solder pads. However, a new problem is created by the large number of personalized substrates or carriers that are required to handle the various combinations of integrated devices. A circuit transposer may be interposed between the integrated devices and the carrier, as suggested in U.S. Pat. No. 3,588,616, to simplify the problem of personalizing each electrical package. However, a circuit transposer should be compatible with the carrier and semiconductor devices from a thermal coefficient expansion (TCE) standpoint. Also, the carrier conductor reliability problem should not be increased or transferred to the transposer. An electrical package that overcomes the problem of TCE mismatch between devices and carriers, part number personalization and control, and solder pad reliability for semiconductor devices and carriers should make the benefits of large scale integration technology more available to data processing systems.

SUMMARY OF INVENTION

A general object of the invention is an improved package for Large Scale Integrated semiconductor technology.

One object is an electrical package that has a carrier and attached semiconductor devices of approximately the same thermal expansion coefficient.

Another object is an electrical package that enables a plurality of Large Scale Integrated devices to connect to a utilization circuit through a standard terminal array.

Still another object is an electrical package that simplifies more precise, reliable, dense carrier personalization to connect a plurality of Large Scale Integrated devices to a utilization circuit.

Another object is an electrical package that has minimum mechanical stress on interconnection members between a carrier and a semiconductor element.

Another object is a process for assembling an electrical package that has minimum thermal expansion coefficient mismatch between semiconductor devices and carrier; improved carrier reliability and personalization to connect the devices through a standard terminal array to a utilization circuit.

In an illustrative embodiment, a carrier or substrate of insulating quality is assembled by (a) disposing a metallic web of low thermal coefficient expansion in a fixture; (b) further positioning in the fixture a standard array of terminal or individually positioned pins to be in the respective openings of the web, and (c) encapsulating the web and a portion of the terminal array in an organic material whereby the terminal pins are exposed on both sides of the encapsulate. One end of the terminal pins serve as connections to a plurality of semiconductor devices in a semiconductor wafer or attached to a circuit transposer which may be of either insulating or semiconductor qualities. The other terminal ends are connected to a utilization circuit. The transposer, in one form, comprises a semiconductor element having suitably disposed diffusions or deposited metal as conductive paths to link the attached semiconductor devices or the devices incorporated therein to the standard terminal array. Solder joints are formed between the respective semiconductor devices, circuit transposer and terminal array to form a complete electrical package. The metallic web alters the thermal coefficient expansion characteristic of the carrier to have substantially the same thermal expansion coefficient as the transposer. Similarly, the thermal expansion coefficient for the semiconductor transposer and the attached semiconductor devices are identical. The substantially constant thermal expansion coefficient for the carrier, transposer and semiconductor devices minimizes mechanical stress on the solder joints. The transposer simplifies personalizing the carrier to connect the plurality of semiconductor devices to a standard terminal array. Carrier definition and reliability are improved by the terminal array in lieu of paste or film conductors adhered thereto.

In another form, the terminal members in the carrier are extended to provide further stress relief to connecting transposer or semiconductor device terminals. The density of semiconductor devices may be increased in the electrical package by (1) attaching semiconductor devices on both sides of the transposer and/or (2) connecting stacked arrays of the devices to the transposer.

A feature of the invention is an electrical package having (a) a carrier that has a thermal expansion coefficient substantially the same as that for a semiconductor, (b) a standard terminal array that permits a plurality of integrated semiconductor devices to be connected to utilization circuits, and (c) a package form factor amenable to mass production fabrication processes.

Another feature is a semiconductor circuit transposer for interconnecting a plurality of semiconductor devices to a carrier, the thermal expansion coefficients for the devices, carrier and transposer being substantially the same.

Still another feature is a semiconductor circuit transposer that may be easily personalized to connect attached semiconductor devices to a standard array of terminal pins included in a carrier.

Another feature is a carrier including terminal members possessing a physical configuration to minimize mechanical stress on terminals attached to semiconductor devices and/or circuit transposer, the stress being due to the difference in thermal expansion coefficients for the carrier and connecting elements.

BRIEF DESCRIPTION OF THE DRAWINGS

These and other objects, features and advantages of the invention will be more fully apprehended from the following specification taken in conjunction with the appended drawing in which:

FIG. 1B and detail thereof 1C is a cross sectional schematic of FIG. 1A showing a plurality of devices attached to the carrier.

DESCRIPTION OF PREFERRED EMBODIMENT

Figure 1A:
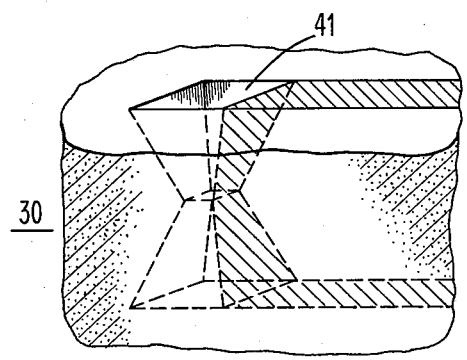
FIG. 1A is a perspective view of an electrical package comprising a carrier, transposer and attached semiconductor devices that employs the principles of the present invention.
Figure 1A:
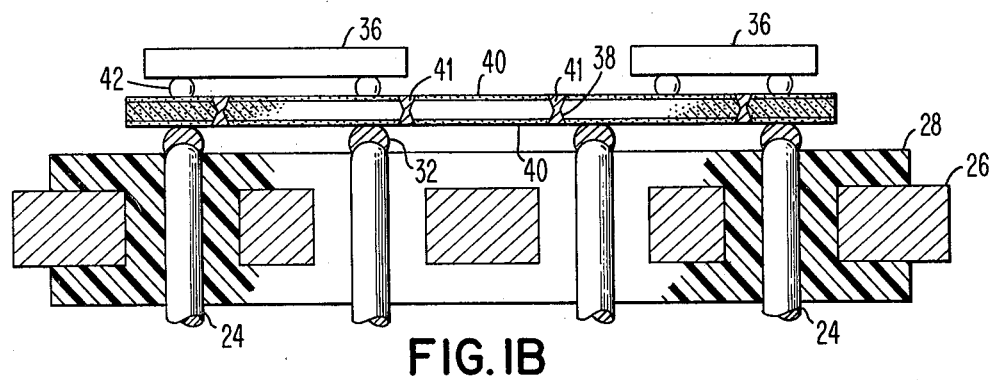
Figure 1A:
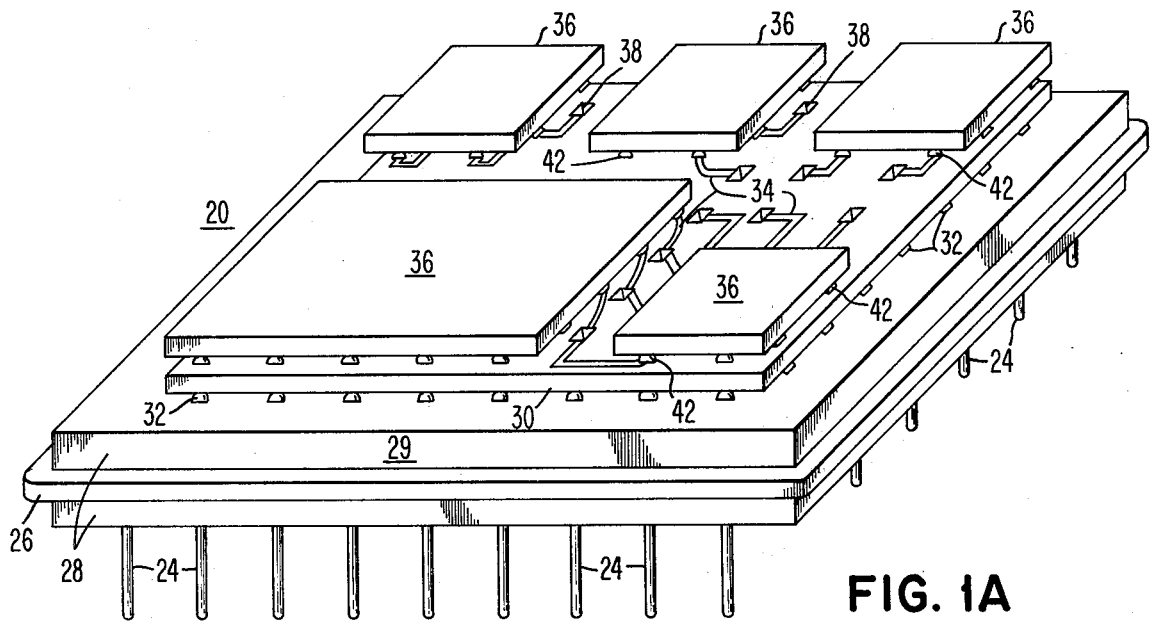

In FIG. 1A, an electrical package 20, employing the principles of the present invention has a plurality of pins 24 positioned within a web 26 (see FIG. 1B). An organic encapsulate 28 encloses the web 26 and a portion of the terminals 24 to form a carrier 29. The terminals are of a metal, e.g., copper or the like, that is readily wettable with solder. The shape of the terminals 24 is selected at one end to permit entry into a conventional printed circuit connector (not shown). The other terminal ends have a configuration to permit attachment to a semiconductor wafer. Normally, the former ends terminate at the surface of the layer 28 to facilitate solder pad joints 32.

The metallic web is fabricated from a material having a low thermal expansion coefficient. Preferably, the thermal expansion coefficient is much lower than that for the semiconductor. In the case of a silicon semiconductor, the thermal expansion coefficient for the member 26 should be of the order of $0-2 \times 10^{-6}$ inch per inch per ° C. One such material having a desired thermal expansion coefficient for silicon devices is INVAR*. The web has appropriate openings or apertures and is formed to a thickness of approximately 30 mils. The web and terminals form a universal pattern to match substantially all connecting circuitry originating from a plurality of semiconductor devices 36.

\* Registered Trademark of Soc. Anon de Commentry - Fourchambault et Decaziville (Acieries d'Imphy)

The organic encapsulate 28 retains the web and pins in fixed positional relationship. The encapsulate also provides electrical isolation among the pins and between the web and the pin pattern. Encapsulates that have been found to be appropriate are generally from the class of plastic, epoxy and novalac materials. Typical encapsulate materials that have been found to be appropriate are Epiall 1914\*\* or 1961\*\*\* which permit the web 26 and the pins to be molded as a unitary structure or carrier or substrate 29. Epiall 1914 organic encapsulate has a thermal expansion coefficient of $14.4 \times 10^{-6}$ inch per inch per degree C. It can be shown that the web 26 lowers the TCE for the encapsulate to approach that of a semiconductor. Typically, the TCE for a semiconductor is of the order of $3 \times 10^{-6}$ inch per inch per ° C.

\*\* Registered Trademark of Allied Chemical Corp., Morristown, N.J.
\*\*\* Registered Trademark of Allied Chemical Corp., Morristown, N.J.

A circuit transposer 30 is joined to the terminal pins 24 by appropriate connections 32, typically solder joints. In one form, the transposer is fabricated from a semiconductor and includes diffused and/or deposited conductors 34 for connecting one or more attached integrated devices 36 to the standard terminal array 24.

Conductive vias 38 (see FIG. 1B) complete the connections from the conductors on one transposer surface to the other surface where the connections 32 are made to the terminal array 24.

The conductors 34 are formed in the transposer by well known deposition or diffusion techniques. An insulating layer 40 (see FIG. 1B), typically a semiconductor oxide film is grown, deposited or otherwise formed to protect the surfaces of the transposer 30. The vias 38 are formed by well known etching, insulating and metallizing processes, more particularly, described in U.S. Pat. No. 3,648,131, also assigned to the present assignee. Briefly, the vias may be precisely formed by preferentially etching a semiconductor wafer from both sides, oxidizing and then depositing metal from each side to form a continuous conductor connecting top and bottom surfaces of the wafer. Each via 38, as shown in FIG. 1B, includes metallization 41 typically aluminum or the like to connect or to receive the connections 32. In one form, openings are made in the bottom side film 40. The pads 32 are formed on the carrier and on the transposer by the process described in U.S. Pat. No. 3,495,133, also assigned to the present assignee. Similarly, appropriate openings are made on the top side film 40 to expose the diffused conductors 34 to match the terminal configuration 42 for the chip devices 36. Metallization is deposited in both the top and bottom openings prior to the formation of solder pads. In one form, the metallized regions comprise films of chromium, copper and gold and the solder pads 32 and 42 are 90% lead and 10% tin. Details of the metallization and solder pad joints are further described in U.S. Pat. No. 3,429,029 also assigned to the present assignee.

The chip devices 36 are conventional integrated semiconductors as described in U.S. Pat. No. 3,508,209, assigned to the present assignee. Each chip device 36 includes metallization and solder pad terminals described in connection with the transposer 30. The number of pads 42 may be more than 100 with good connection reliability because of the matching thermal expansion coefficients for the transposer, carrier and chip. FIGS. 1A and 1B show that a plurality of the devices 36 can be attached to the transposer for connection through the conductors and vias to the standard terminal array 24. The transposer 30 provides flexibility to personalize the chip terminal configuration to the standard terminal array 24. Assembly and distribution of the electrical package 20 is facilitated because the transposer can be customized to a customer request and bonded to the chip devices and carrier which are manufactured and stored in advance of the request.

Figure 2A:
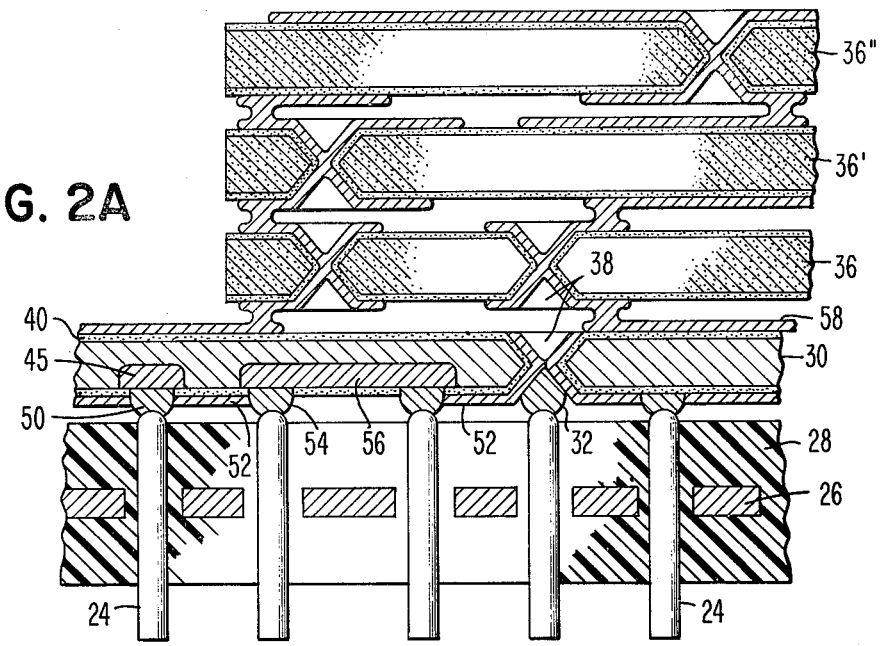
FIG. 2A is a schematic view of another form of the invention of FIG. 1A.
Figure 2C:
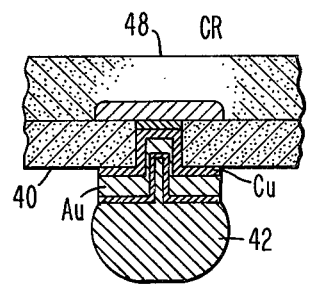
FIG. 2B and detail thereof 2C is a schematic view of still another form of the invention of FIG. 1A.

The transposer 30 also permits the integrated devices to be stacked on top of one another, as shown in FIG. 2A. The transposer 30 includes active elements 45 having one terminal 50 connected by metallization 52 on the surface of the insulating layer 40 to a terminal 54 of a passive element 56. Metallization 52 also connects the passive element 56 to the via 38 which forms a connection to top side metallurgy 58 on the transposer. A series of integrated devices 36, 36' and 36" are arranged in a stacked array, as described in U.S. Pat. No. 3,648,131, assigned to the present assignee. For ease of illustration, the active and passive elements in the integrated devices 36, 36' and 36" are not shown. The package of FIG. 2A (1) reduces the number of solder pad connections thereby improving reliability; (2) substitutes for metallized conductors 52 for the diffused conductors 34 of FIG. 1A, and (3) employs active/passive elements in the transposer element to further increase the density of circuits and resulting electrical function that may be performed with the package. Additional advantages are that the increased chip and circuit density improves the speed of performing logical functions; eliminates the need of off-chip drivers for the logical functions and reduces line capacitance.

Figure 2B:
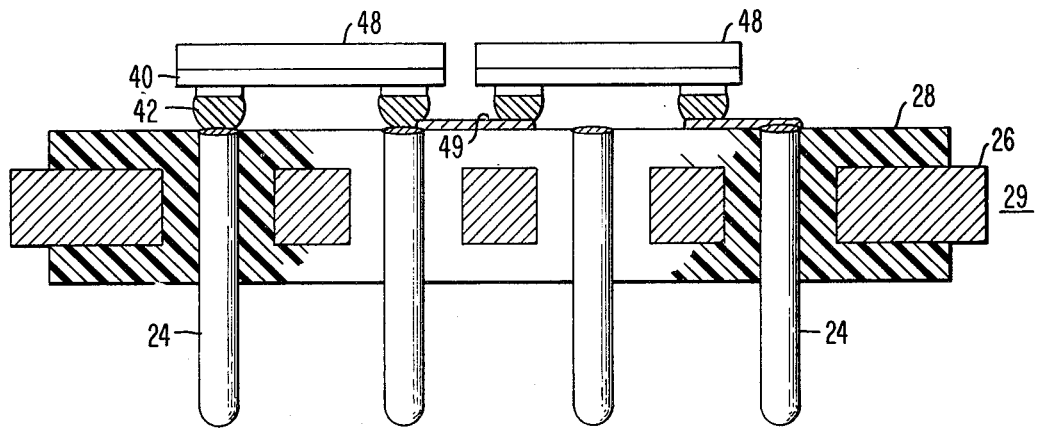

In another form, as shown in FIG. 2B, one or more wafer(s) 48 including active and passive elements (not shown) is directly connected to the standard terminal array through metallized terminals 42, identical to the chip terminals described in FIG. 1A. The active and passive devices may be on both surfaces of the wafer 48. The carrier 29 matches the thermal expansion coefficient of the wafer(s) 48 thereby minimizing mechanic stress on the terminals 42. The connections between the terminals 42 and the pins 24 may be direct or through metallized conductors 49 either film or paste deposited on the carrier.

Figure 3D:
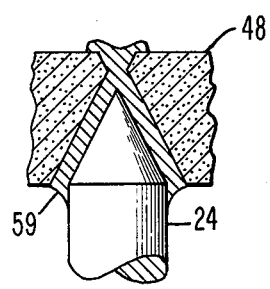
FIG. 3A and detail thereof 3D is a schematic of an electrical package that compensates for thermal expansion coefficient mismatch between an interconnected inorganic carrier and semiconductor member.
FIG. 3B and detail thereof 3E is a schematic of the electrical package of FIG. 3A wherein the semiconductor member is a large scale integrated semiconductor wafer.
FIG. 3C is a schematic of the electrical package of FIG. 1A using the invention principle of FIG. 3A.
Figure 3A:
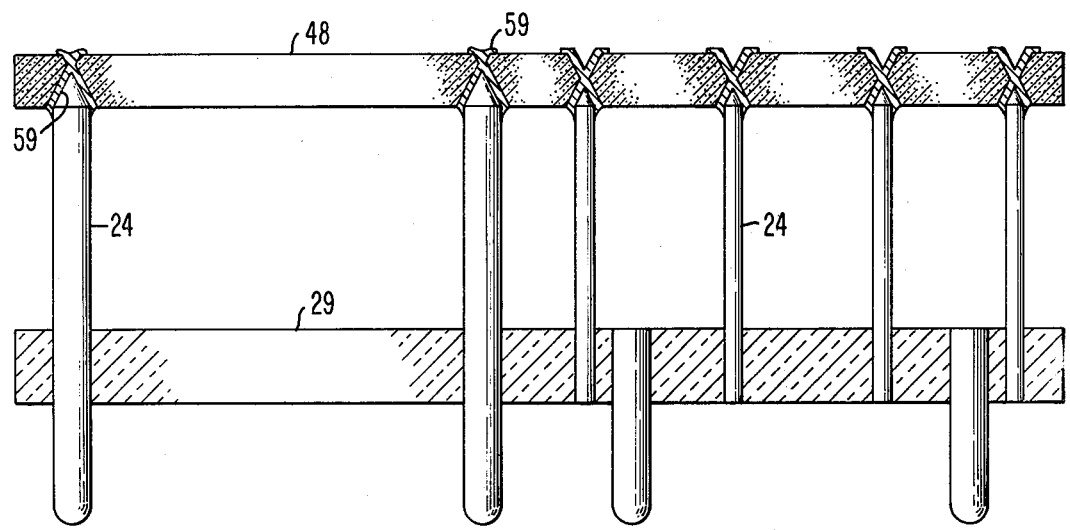

FIG. 3A shows another embodiment of the invention. The carrier 29 may be an inorganic material, e.g., aluminum trioxide or the like instead of the metal web 26 and organic encapsulate 28, described in FIG. 1A. The terminal members 24 are imbedded in the carrier 29 and have a length that extends about a ½ inch beyond the carrier before engaging a semiconductor transposer 30 or wafer 48. The terminals 24 are connected to the elements 30 or 48 at solder joints 59. The TCE mismatch exists between the inorganic area 29 and semiconductor element 48. Typically, the carrier has a thermal expansion coefficient of $6 \times 10^{-6}$ inch per inch per °C whereas the semiconductor has a coefficient of $3 \times 10^{-6}$ inch per inch per °C. It can be shown that the TCE mismatch develops a mechanical stress which causes thermal fatigue of the solder joints 59. The extended terminal members 24 however relieve this mechanical stress. The members 24 are of copper or the like and their length and thickness are selected as a function of chip size and the ambient temperature change. Normally, the thickness of the terminal members 24 is of the order of 5 to 10 mils. The mechanical stress generated in the terminals is distributed to the carrier 29 in which they are installed or staked. The pin and socket light connection between the terminals 24 and the wafer 48 provide (a) increased mechanical strength to the joints 51, and (b) part of the positioning of the wafer and carrier during assembly. The socket is formed by the same method as the conductive vias, previously described. However, etching is performed to form the top opening in the wafer to be smaller than the bottom opening to (1) facilitate positioning of the engaging pin and (2) enhance mechanical strength of the joint.

Figure 3C:
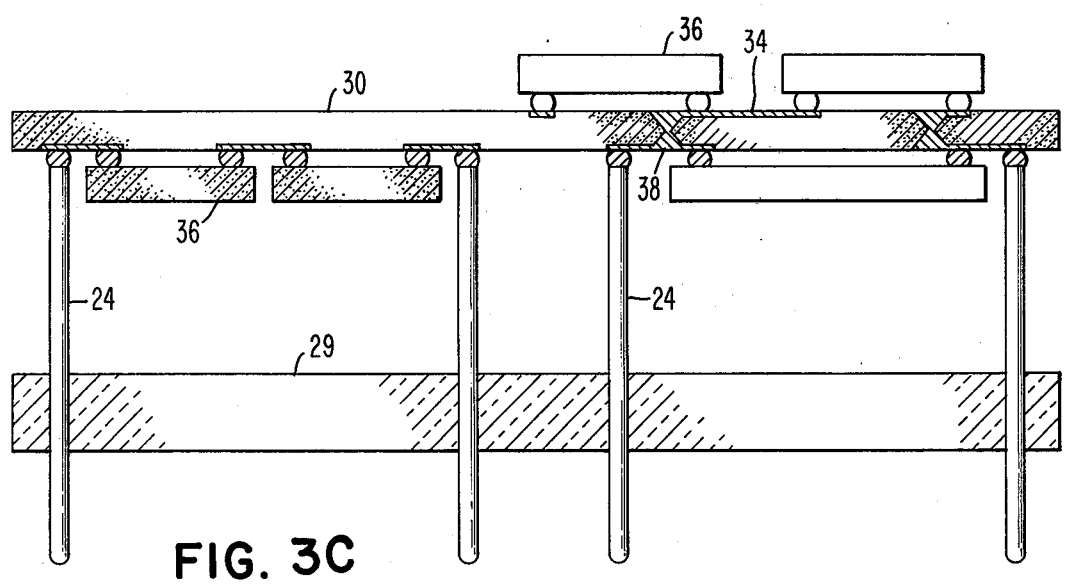
Figure 3E:
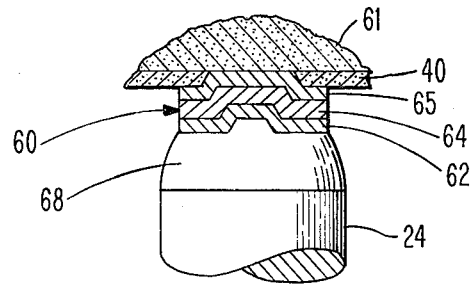
Figure 3B:
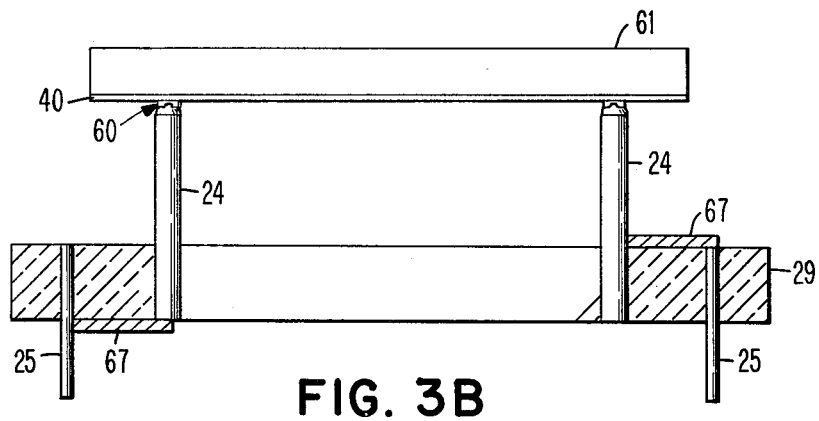

The terminal 24 may also be directly connected to the terminals 60 of an integrated device 61 including an oxide layer 40, as shown in FIG. 3B. The terminals 60 are joined to the device 61 through metallized layers of gold 62, copper 64, chrome 65, and solder 68, previously described in conjunction with FIG. 2B. It can be shown that the terminals 60 should have a cross sectional area that is less than the cross sectional area of the terminals 24 at their intersection. Typically, the ratio of 1:1 to 1:1.6 for the respective areas is suitable. The staked terminals 24 are connected by metallization 67 which may be screened or film deposited, as appropriate, on the upper or lower surfaces of the carrier 29 to other staked terminals 25. Again, the extended length of the terminals 24 absorbs the mechanical stress from the differences in thermal expansion coefficients for the semiconductor and the ceramic carrier 29.

In FIG. 3C, the transposer 30 of FIG. 1A is shown connected to the terminals 24 of FIG. 3A. The additional clearance between the carrier 29 and the transposer 30 permits attachment of the integrated devices 36 to the bottom as well as to the top surface of the transposer 30. The bottom devices may be connected to the terminals 24 by way of the diffused conductors 34 or metallization (not shown). The conductive vias 38 connect the top devices 36 to the terminals 24 by either the diffused conductors 34 or metallization (not shown) linked to the vias 38.

Figure 4:
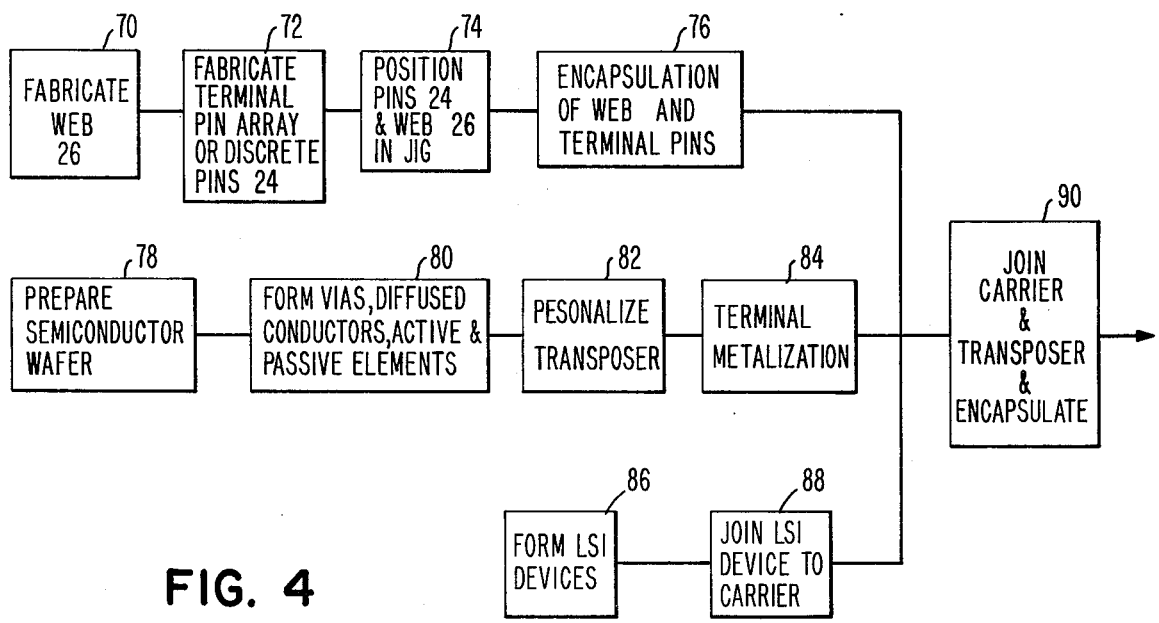
FIG. 4 is a flow diagram of a process for assembling the invention shown in FIG. 1A.

The electrical package of the present invention may be assembled by the process shown in FIG. 4. An operation 70 prepares a metallic web 26 of INVAR or the like by conventional stamping or coining processes, well known in the art. The web, as noted before, has a thickness of approximately 30 mils. The terminal pin array 24 is fabricated in an operation 72. In one form, the terminals 24 are either punched from the solid sheet or extruded into the desired configuration and cross sectioned. An operation 74 positions the terminal array 24 within the apertures (not shown) in the web 26. Any convenient jig may be utilized to retain the array 24 and the web 26 in fixed positional relationship. The array 24 and the web 26 are encapsulated in a conventional molding process in an operation 76. Alternatively, the pins may be automatically fixed into position in the mold prior to the molding step. Portions of the terminals 24 are excluded from the molding. The terminal ends engaging the transposer or semiconductor element are lapped to be level with the top surface of the carrier. The encapsulate may be an inorganic material, as previously described. Details for preparing the organic material and performing the molding operation are well known in the art. Where the carrier 29 is an inorganic material, the terminals are implanted or staked in the material. One staking technique is described in U.S. Pat. No. 3,257,708, assigned to the present assignee. Upon completion of the operation 76, the carrier is ready to be connected to the circuit transposer 30.

An operation 78 prepares a semiconductor wafer, as the circuit transposer. The wafer is subjected to the usual cleaning, polishing and etching processes to prepare the surfaces to receive diffusions and/or depositions as conductors or active or passive elements. Details for preparing the wafer surfaces are described in U.S. Pat. No. 3,508,209, supra. An operation 80 forms insulating layer 40 on the wafer. Conventional planar processes are employed to form the diffusion paths, active and passive elements. The vias 34 are formed in the wafer by the process described in U.S. Pat. No. 3,648,131, supra. An operation 82 personalizes the diffused or metallized conducting paths on the wafer according to the chip devices and associated terminal configurations. In an operation 84, terminal metallurgy is formed for the transposer. Chromium, copper and gold are deposited in openings in the insulating layer 40 to form the connections to the diffused conductors and other elements in the wafer. Solder pads are formed at appropriate vias, diffused or deposited conductors and active/passive elements depending upon the electrical functions to be performed by the package.

The transposer is now in condition to have the integrated devices 36 attached thereto prior to assembly with the carrier. The integrated devices are formed by conventional processes. The devices may be FET and/or bipolar active elements. Resistors, capacitors and other elements may also be formed in or on the integrated devices. U.S. Pat. No. 3,508,209 describes the processes and structures for typical large scale integrated devices. An operation 88 joins the LSI devices to the transposer using the solder joining techniques, described in U.S. Pat. No. 3,495,133, supra.

The carrier and the combined transposer/integrated devices are joined together in an operation 90 by the same processes executed in the operation 88. A metal housing may be attached to the carrier to enclose the transposer and attached integrated devices as protection during handling. After testing through the terminals 24, the electrical package is ready for application to electronic equipment. The extensive circuitry now possible in the package may require special internal cooling, e.g., liquid sealed in flurocarbons.

Similar processes may be employed to assemble the electrical package of FIGS. 3A, 3B and 3C.

While the invention has been shown and described in conjunction with specific embodiments, it should be understood by those skilled in the arts that various changes in form and scope may be made without departing from the spirit and scope of the invention.

What is claimed is:

1. An electrical package for large scale integrated devices comprising
   a. a carrier having terminal members supported therein having circuits thereon,
   b. a circuit transposer attached to the carrier terminal members with at least one semiconductor active element mounted on the transposer, the transposer being of the same material as the active element,
   c. the carrier being a plastic substrate, having a greater coefficient of thermal expansion than the active element, and uniformally encapsulating an imbedded metallic web having a coefficient of thermal expansion lower than the active element to make the overall coefficient of expansion of the carrier equal to the active element,
   d. the coefficient of thermal expansion of the carrier, transposer and semiconductor active element being 3:3:3 when at operating temperature.

* * * * *